US008645583B2

(12) United States Patent
Vu et al.

(10) Patent No.: US 8,645,583 B2
(45) Date of Patent: Feb. 4, 2014

(54) ZERO PIN SERIAL INTERFACE

(75) Inventors: Hoa Vu, Milipitas, CA (US); Ping Huang, Fremont, CA (US)

(73) Assignee: Intersil Americas Inc., Milpitas, CA (US)

( * ) Notice: Subject to any disclaimer, the term of this patent is extended or adjusted under 35 U.S.C. 154(b) by 28 days.

(21) Appl. No.: 13/075,617

(22) Filed: Mar. 30, 2011

(65) Prior Publication Data

US 2012/0075006 A1 Mar. 29, 2012

Related U.S. Application Data

(60) Provisional application No. 61/385,900, filed on Sep. 23, 2010.

(51) Int. Cl.
*H01H 37/76* (2006.01)

(52) U.S. Cl.
USPC ............................ 710/8; 327/525; 365/225.7

(58) Field of Classification Search
USPC ......................................... 327/525; 365/225.7
See application file for complete search history.

(56) References Cited

U.S. PATENT DOCUMENTS

| 5,440,305 | A | * | 8/1995 | Signore et al. ................ 341/120 |
| 6,338,032 | B1 | * | 1/2002 | Chen ............................... 703/16 |
| 6,346,847 | B1 | | 2/2002 | Capici et al. |
| 6,366,154 | B2 | * | 4/2002 | Pulvirenti ...................... 327/525 |
| 6,586,985 | B1 | * | 7/2003 | Romas et al. .................. 327/525 |
| 6,621,284 | B2 | | 9/2003 | D'Angelo |
| 6,654,304 | B1 | * | 11/2003 | Huang ........................ 365/225.7 |
| 7,940,113 | B2 | * | 5/2011 | Kawagoshi .................... 327/525 |
| 2004/0216019 | A1 | * | 10/2004 | Shyr et al. ...................... 714/724 |
| 2008/0111576 | A1 | * | 5/2008 | Shyr et al. ...................... 324/765 |
| 2011/0249258 | A1 | * | 10/2011 | Rueger et al. .................. 356/213 |

* cited by examiner

*Primary Examiner* — Ernest Unelus
(74) *Attorney, Agent, or Firm* — Fogg & Powers LLC

(57) ABSTRACT

A method for controlling performance of an integrated circuit using a zero-pin serial interface is provided. The method comprises identifying a desired performance characteristic of the circuit, and transmitting a first change mode signal to the circuit on a first pin to cause the circuit to enter an instruction reception mode, with the first pin performing differently during a normal operation mode. The method also comprises transmitting a performance adjusting instruction to the circuit on a second pin when the circuit is in the instruction reception mode, with the second pin performing differently during the normal operation mode, and transmitting a second change mode signal to the circuit on the first pin to cause the circuit to enter the normal operation mode. An output performance of the circuit is compared to the desired performance characteristic, with the output performance being the performance of the circuit during the normal operation mode. The circuit is set to permanently provide the output performance when the output performance is within a desired tolerance of the desired performance characteristic.

24 Claims, 5 Drawing Sheets

US 8,645,583 B2

ZERO PIN SERIAL INTERFACE

CROSS REFERENCE TO RELATED APPLICATIONS

This application claims the benefit of priority to U.S. Provisional Application No. 61/385,900, filed on Sep. 23, 2010, the disclosure of which is incorporated herein by reference.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
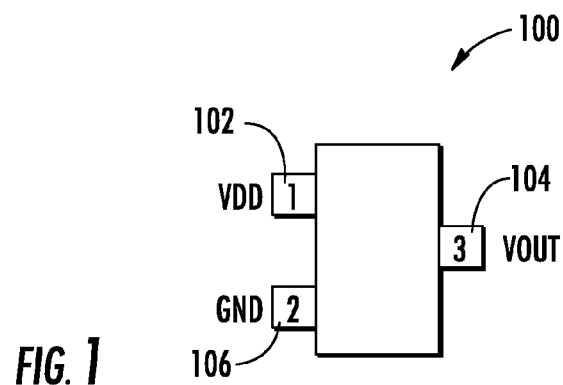
FIG. 1 is an illustration of one embodiment of an integrated circuit with a zero pin serial interface.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual acts may be performed. The following detailed description is, therefore, not to be taken in a limiting sense.

FIG. 1 is an illustration of one embodiment of an integrated circuit package 100 with a zero pin serial interface. Integrated circuit package 100 includes a first pin 102, a second pin 104, and a ground pin 106. First pin 102, second pin 104, and ground pin 106 allow signals to communicate with and be transmitted from an encapsulated integrated circuit. During normal operation of the integrated circuit, first pin 102, second pin 104, and ground pin 106 are dedicated to a particular function of the integrated circuit. For example, when the integrated circuit acts as a voltage reference, first pin 102 acts as an input voltage (VDD), second pin 104 acts as an output voltage reference (VOUT), and ground pin 106 (GND) provides a ground reference to the integrated circuit. FIG. 1 illustrates an embodiment with three pins, however, this disclosure applies to circuits with greater or fewer pins, where, during normal operations, the pins on the integrated circuit package are used for a purpose other than post-package trimming.

In certain embodiments, when the integrated circuit is adjusted after packaging, first pin 102 and second pin 104 are used to post-package trim the integrated circuit. A signal is sent into first pin 102 that instructs the integrated circuit to operate in a mode of operation different from normal operation mode. The phrase "normal operation mode," as used herein generally refers to a mode of operation where the integrated circuit is performing its primary design function. For example, when the integrated circuit is designed to be a voltage reference, in the normal operation mode, first pin 102 is connected to an input voltage and second pin 104 is transmitting a voltage reference as an output. When a change mode signal is transmitted to first pin 102, the change mode signal changes the operative mode of the integrated circuit to an instruction reception mode, such that the integrated circuit receives instructions on second pin 104. The term "operative mode," as used herein, generally refers to the mode in which the integrated circuit is currently operating. The phrase "instruction reception mode," as used herein, generally refers to the operative mode where the integrated circuit can receive instructions on second pin 104. For example, when the integrated circuit is in the instruction reception mode, second pin 104 receives signals that adjust the performance characteristics of the integrated circuit.

Figure 2:
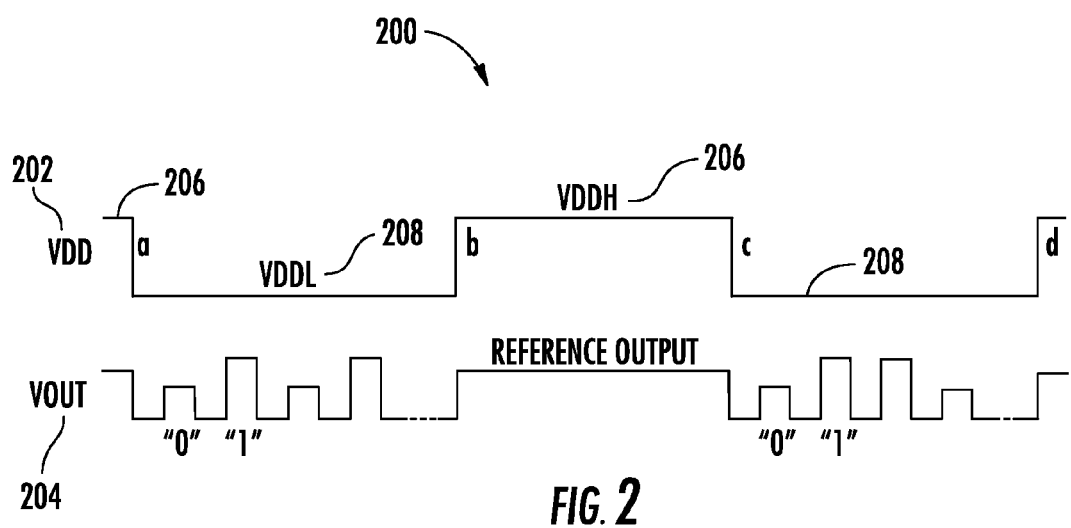
FIG. 2 is a timing diagram for signals that may be transmitted to an integrated circuit with a zero pin serial interface according to one embodiment.

FIG. 2 is a timing diagram 200 illustrating for instructions that can be sent to an integrated circuit through a zero pin serial interface. Timing diagram 200 includes a first pin signal 202 and a second pin signal 204. First pin signal 202 is transmitted into the integrated circuit through first pin 102 in FIG. 1. When the integrated circuit recognizes first pin signal 202 as a command to move into an instruction reception mode, the integrated circuit moves into the instruction reception mode and is capable of receiving instructions on second pin 104.

For example, first pin 102 receives a high voltage level 206 during normal operation mode. When the voltage level transitions from high voltage level 206 to a low voltage level 208, the integrated circuit recognizes the transition from high voltage level 206 to low voltage level 208 as a first change mode signal to enter the instruction reception mode and receive instructions on second pin 104.

Further, when first pin signal 202 transitions from low voltage level 208 to high voltage level 206, the integrated circuit recognizes the transition from low voltage level 208 to high voltage level 206 as a second change mode signal to transition back into the normal operation mode. In a further embodiment, first pin signal 202 also instructs the integrated circuit to move out of its normal operation mode through a series of transmitted bits, series of waves, or other signal that the integrated circuit can recognize as a change mode signal, instructing the integrated circuit to change its operative mode.

In certain embodiments, when the integrated circuit is in the instruction reception mode, second pin signal 204 adjusts the performance characteristics of the integrated circuit. For example, where the integrated circuit is a voltage reference, second pin signal 204 transmits commands to the integrated circuit that alter the output and performance of the integrated circuit during the normal operation mode.

Table 1 illustrates several commands that second pin signal 204 communicates to the integrated circuit through second pin 104 in FIG. 1.

TABLE 1

Exemplary Instruction Commands

| Exemplary Command Format | CCCC_AAAA_DDDD_DDDD_DDDD_..._... | |
|---|---|---|
| Command Description | CCCC-Command  AAAA-Address  DDDD-Register Data | |

| Command | Command Description |
|---|---|
| *Exemplary Action Commands (address and data are not required)* | |
| 0000 | Output voltage reference on VOUT pin |
| 0011 | Update fuse readers |
| 0100 | Test mode to read fuses with 50K Ohm |
| 0101 | Output bandgap voltage on VOUT pin |
| *Exemplary Data Access Commands* | |
| 1001_0000_DDDD_DDDD | Read fuse data from address 0h |
| 1001_0001_DDDD_DDDD | Read fuse data from address 1h |
| 1001_0001_DDDD_DDDD_DDDD_DDDD | Read fuse data from addresses 0h and 1h |
| 1100_0000_DDDD_DDDD | Write to registers from address 0h |
| 1100_0001_DDDD_DDDD | Write to registers from address 1h |
| 1100_0001_DDDD_DDDD_DDDD_DDDD | Write to registers from address 0h and 1h |
| 1101_0000_DDDD_DDDD | Read register data from address 0h |
| 1101_0001_DDDD_DDDD | Read register data from address 1h |
| 1101_0001_DDDD_DDDD_DDDD_DDDD | Read register data from address 0h and 1h |
| *Special blow fuses commands* | |
| 1110_0000_0001 | Blow fuses from address 0h |
| 1110_0001_0001 | Blow fuses from address 1h |
| 1111_1001_1000_0011_1011 | Blow last fuse |

Table 1 lists exemplary action commands that may be sent to instruct the integrated circuit to perform certain tasks. For example, the command 0000 is sent to the integrated circuit to cause the integrated circuit to output a voltage reference during the normal operation mode. Other action commands may include commands that instruct the integrated circuit to update any fuse readers, output the bandgap voltage instead of the voltage reference, enter a test mode to read fuse data stored on the integrated circuit, and the like.

In another embodiment, second pin signal 204 communicates data access commands to the integrated circuit on second pin 104 as set forth in Table 1. For example, second pin signal 204 includes commands to read fuse data from an identified address on the integrated circuit, write to registers on the integrated circuit, read register data on the integrated circuit, and the like. Further, after the commands adjust the voltage reference, such that it provides the desired voltage, second pin signal 204 communicates instructions to blow selected fuses on the integrated circuit. By blowing specified fuses, the voltage reference is trimmed to a specific voltage and permanently set to provide the desired voltage.

In at least one embodiment, first pin signal 202 instructs the integrated circuit to move from the normal operation mode into the instruction reception mode. When the integrated circuit is in the instruction reception mode, second pin signal 204 transmits commands to adjust the performance of the integrated circuit. After the integrated circuit has received the commands, first pin signal 202 may command the integrated circuit to move back into its normal operation mode. While in the normal operation mode, the performance of the integrated circuit is tested to determine if it is performing within a designed tolerance. If the integrated circuit needs further adjustments to achieve the desired performance, first pin signal 202 commands the integrated circuit to reenter the instruction reception mode for further adjustments. The process of adjusting the integrated circuit and testing the performance of the integrated circuit can be repeated until the integrated circuit is operating as desired. When the integrated circuit is operating as desired, first pin signal 202 instructs the integrated circuit to enter the instruction reception mode where second pin signal 204 commands the integrated circuit to blow fuses to permanently set the performance characteristics of the integrated circuit.

Figure 3:
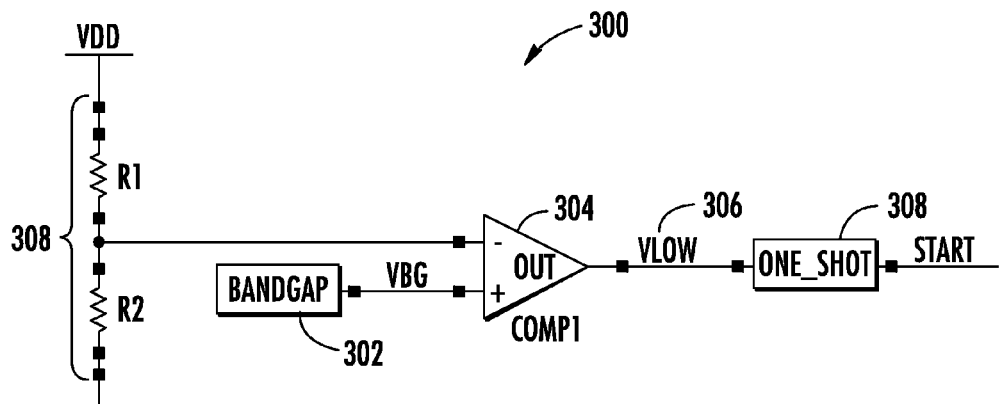
FIG. 3 is a schematic diagram of one embodiment of a detection circuit that may signal to an internal state machine to receive instructions.

FIG. 3 illustrates one embodiment of a detection circuit 300 that detects an instruction received on first pin 102 in FIG. 1, which commands the integrated circuit to enter the instruction reception mode. Detection circuit 300 includes a bandgap voltage source 302, a comparator 304, a VLOW 306, a resistor divider 308 comprised of resistors R1 and R2, and a one-shot start command 308. In certain embodiments, bandgap voltage 302 (VBG) is compared against a voltage across resistor divider 308 connected to first pin 102 and receives first pin signal 202 in FIG. 2 (VDD). When first pin signal 202 transitions from high voltage level 206 to low voltage level 208, comparator 304 causes VLOW 306 to rise and cause one-shot start command 308 to send a start pulse, instructing the integrated circuit to enter the instruction reception mode. When first pin signal 202 transitions from low voltage level 208 to high voltage level 206, VLOW 306 goes low and commands the integrated circuit to move into the normal operation mode. As the voltage transitions from high to low, the voltage received on first pin 102 will move down to a trip point. When the voltage reaches the trip point, the voltage will command the integrated circuit to enter the instruction reception mode. The voltage trip point is represented by equation 1.

$$VDD_{trip} = VBG * \left(\frac{R1 + R2}{R2}\right) \qquad (1)$$

Figure 4:
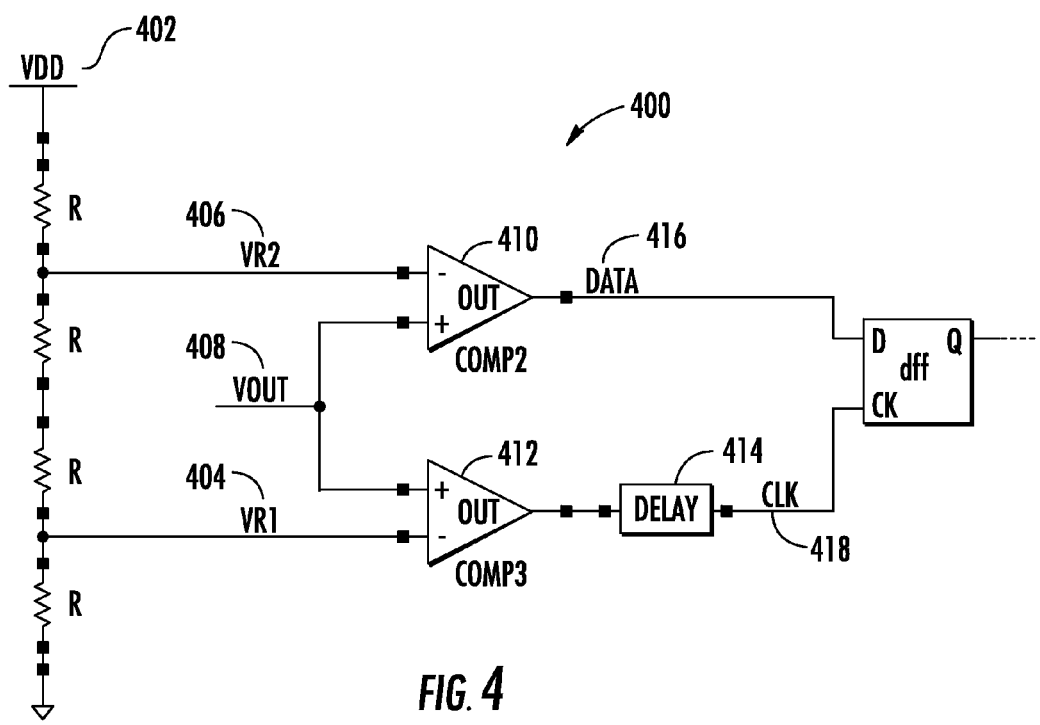
FIG. 4 is a schematic diagram of one embodiment of a clock and data circuit that may receive instructions for the integrated circuit.

FIG. 4 illustrates one embodiment of a clock and data detection circuit 400 that receives instructions for the integrated circuit. Clock and data detection circuit 400 includes VDD 402, VR1 404, VR2 406, VOUT 408, a first comparator 410, a second comparator 412, a delay 414, a DATA signal 416, and a clock (CLK) signal 418. In certain embodiments, second input signal 204 in FIG. 2 is transmitted into the clock and data detection circuit 400 through VOUT 408. Clock and data detection circuit 400 compares VOUT 408 with VR2 406 through first comparator 410 and compares VOUT 408 with VR1 404 through second comparator 412.

In certain embodiments the voltage of VR2 406 may be three fourths of the voltage of VDD 402, where VDD 402 is the voltage received through the first pin 102 in FIG. 1. Further, the voltage of VR1 404 may be one fourth of the voltage of VDD 402. The voltages of VR1 404 and VR2 406 are at one fourth and three fourths of the voltage of VDD 402 to avoid data glitches that may enter the system. Further, after the signal on VOUT 408 is compared against VR2 406 through first comparator 410, DATA signal 416 is output. After the signal on VOUT 408 is compared against VR1 404 through second comparator 412, the signal output passes through delay 414 before becoming CLK signal 418. The delay 414 delays CLK signal 418 a period of time, where the delay time allows an internal state machine to prepare DATA signal 416 such that the data contained in DATA signal 416 can be compared against CLK signal 418. Thus, the delay time of 414 is long enough to satisfy the DATA setup time requirement. The signals at DATA 416 and CLK 418 are used by an internal state machine to adjust the performance of the integrated circuit.

Figure 5:
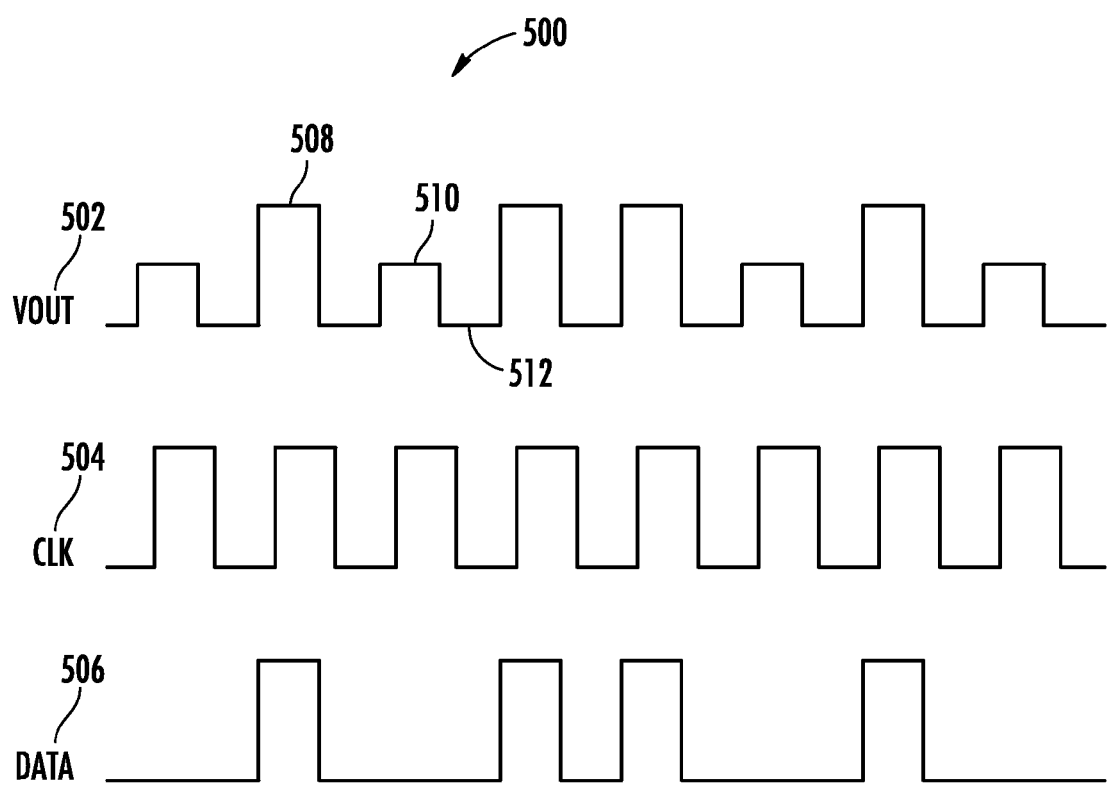
FIG. 5 is a timing diagram for data received by an integrated circuit with a zero pin serial interface according to one embodiment.

FIG. 5 is a timing diagram 500 for data received by an integrated circuit with a zero pin serial interface. The timing diagram illustrates a VOUT signal 502 received at VOUT 408 in FIG. 4, a CLK signal 504 present at CLK 418, and a DATA signal 506 present at DATA signal 416. As shown, VOUT signal 502 is a tri-level signal having three voltage levels: a high voltage level 508, a middle voltage level 510, and a low voltage level 512. CLK signal 504 and DATA signal 506 are extracted from tri-level VOUT signal 502. For example, when extracting DATA signal 506 from VOUT signal 502, high voltage 508 level indicates a "high" level in DATA signal 506 while middle voltage level 510 indicates a "low" level. Low voltage level 512 indicates no data and also indicates a "low" level. When extracting CLK signal 504 from VOUT signal 502, both high voltage level 508 and the middle voltage level 510 cause CLK signal 504 to go "high" while low voltage level 512 causes CLK signal 504 to go "low". As was aforementioned, the internal state machine uses the data contained in DATA signal 506 and CLK signal 504 to adjust the performance of the integrated circuit. For example, the internal state machine derives instructions from DATA signal 506 and acquires synchronization information from CLK signal 504.

Figure 6:
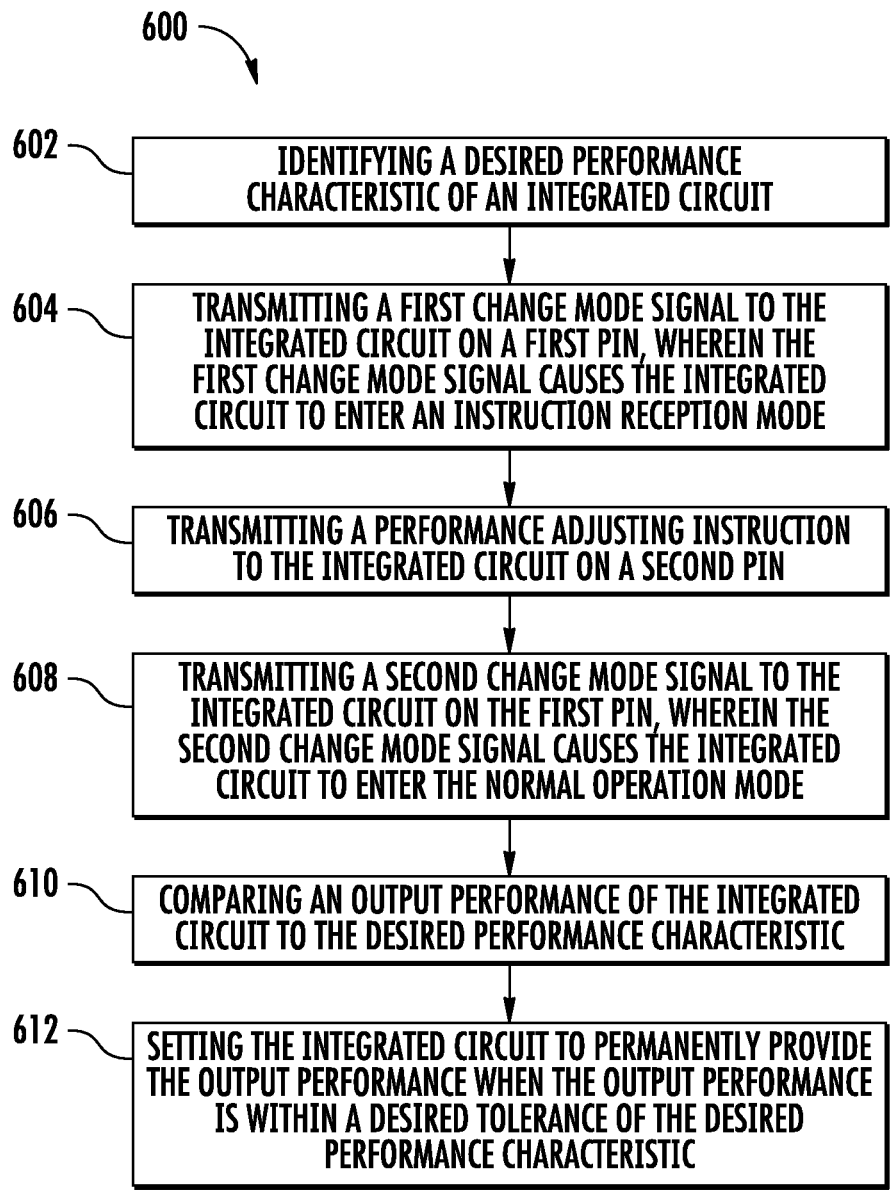
FIG. 6 is a flowchart of one embodiment of a method for adjusting the performance of an integrated circuit using a zero pin serial interface.

FIG. 6 is a flowchart of a method 600 for adjusting the performance of an integrated circuit using a zero pin serial interface. At block 602, a desired performance characteristic of an integrated circuit may be identified. For example, an integrated circuit may be a voltage reference, and the circuit may have a desired voltage output. At block 604, a first change mode signal may be transmitted to the integrated circuit on a first pin of an integrated circuit package, wherein the first change mode signal may cause the integrated circuit to enter an instruction reception mode. For example, a transition in voltage levels from a high voltage to a low voltage may cause the integrated circuit to enter the instruction reception mode. Further, when the integrated circuit is in a normal operation mode, the first pin may be used for a purpose other than changing the operative modes of the integrated circuit.

In certain embodiments, at block 606, a performance adjusting instruction may be transmitted to the integrated circuit on a second pin. For example, a performance adjusting instruction may change the output voltage of the integrated circuit during the normal operation mode. Similar to the first pin, the second pin may also be used for a purpose other than receiving instruction when the integrated circuit is in the normal operation mode. Further, at block 608, a second change mode signal may be transmitted to the integrated circuit on the first pin, wherein the second change mode signal may cause the integrated circuit to enter the normal operation mode. For example, the second change mode signal may be a signal on the first pin that transitions from a low voltage to a high voltage, which instructs the integrated circuit to enter the normal operation mode.

In at least one embodiment, at block 610, an output performance of the integrated circuit may be compared to the desired performance characteristic. For example, after the integrated circuit moves into the normal operation mode, the output voltage of the integrated circuit may be compared to a desired output voltage. If the output performance of the integrated circuit is outside a desired tolerance of the desired performance characteristic, blocks 604 through 610 may be repeated until the output performance of the integrated circuit is within the desired tolerance. At block 612, when the output performance is within a desired tolerance of the desired performance characteristic, the integrated circuit may be permanently set to provide the output performance. For example, an instruction may be sent into the integrated circuit during instruction reception mode that blows fuses, preventing the ability to adjust the performance of the integrated circuit.

Figure 7:
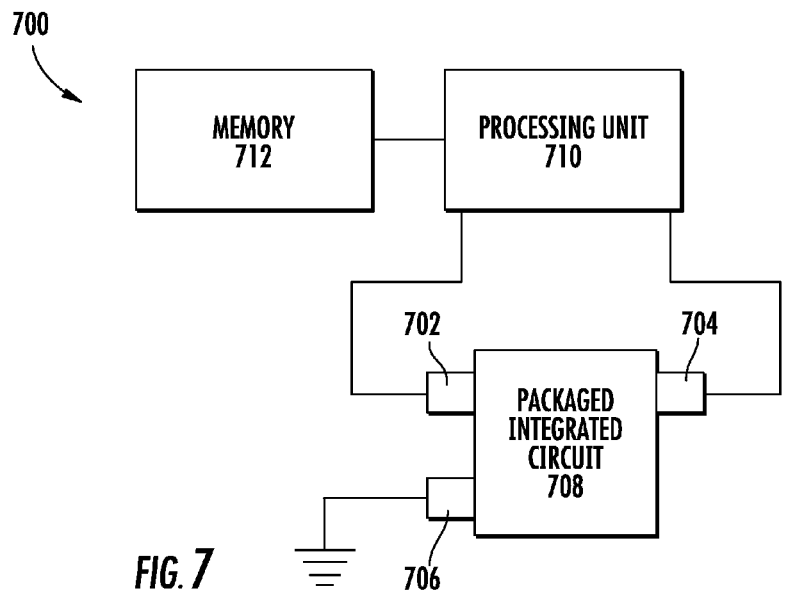
FIG. 7 is a block diagram of one embodiment of a system for post package trimming.

FIG. 7 is a block diagram of one embodiment of a system 700 for post package trimming. System 700 includes a packaged integrated circuit 708, which in turn includes a first pin 702, a second pin 704, and a ground pin 706. Packaged integrated circuit 708 along with first pin 702, second pin 704, and ground pin 706 function similarly to integrated circuit package 100 in FIG. 1, which includes first pin 102, second pin 104, and ground pin 106. First pin 702, second pin 704, and ground pin 706 likewise function similarly to first pin 102, second pin 104, and ground pin 106, respectively.

System 700 also includes a processing unit 710 and a memory 712. Processing unit 710 comprises one or more processing devices that are configured to send commands to packaged integrated circuit 708 on first pin 702 and second pin 704. For example, processing unit 710 transmits a change mode signal to first pin 702 to change the mode of packaged integrated circuit 708 from a normal operation mode to an instruction reception mode. Processing unit 710 can also transmit a change mode signal to first pin 702 to change the mode of packaged integrated circuit 708 from the instruction reception mode back to the normal operation mode. Further, when packaged integrated circuit 708 is in the instruction reception mode, processing unit 710 can transmit performance adjusting instructions to packaged integrated circuit 708 on second pin 704 to adjust the performance of the packaged integrated circuit 708. To access the performance adjusting instructions, processing unit 710 accesses memory 712. Memory 712 includes at least one memory device configured to store the performance adjusting instructions.

When processing unit 710 accesses memory 712 and transmits a performance adjusting instruction to second pin 704 on packaged integrated circuit 708, processing unit 710 transmits a change mode signal to first pin 702 to change the mode of packaged integrated circuit 708 to the normal operation mode. When packaged integrated circuit 708 is in normal operation mode, packaged integrated circuit 708 transmits an output signal from second pin 704 to processing unit 710. If the signal matches the desired performance of packaged integrated circuit 708, processing unit 710 sets the mode of packaged integrated circuit 708 to instruction reception mode and transmits commands to packaged integrated circuit 708 to permanently set the performance of packaged integrated circuit 708 to perform as packaged integrated circuit 708 currently operates. If the signal received from packaged integrated circuit 708 fails to match a desired performance, processing unit 710 sets the mode of packaged integrated circuit 708 to instruction reception mode and transmits further performance adjusting instructions to change the performance of packaged integrated circuit 708.

Figure 8:
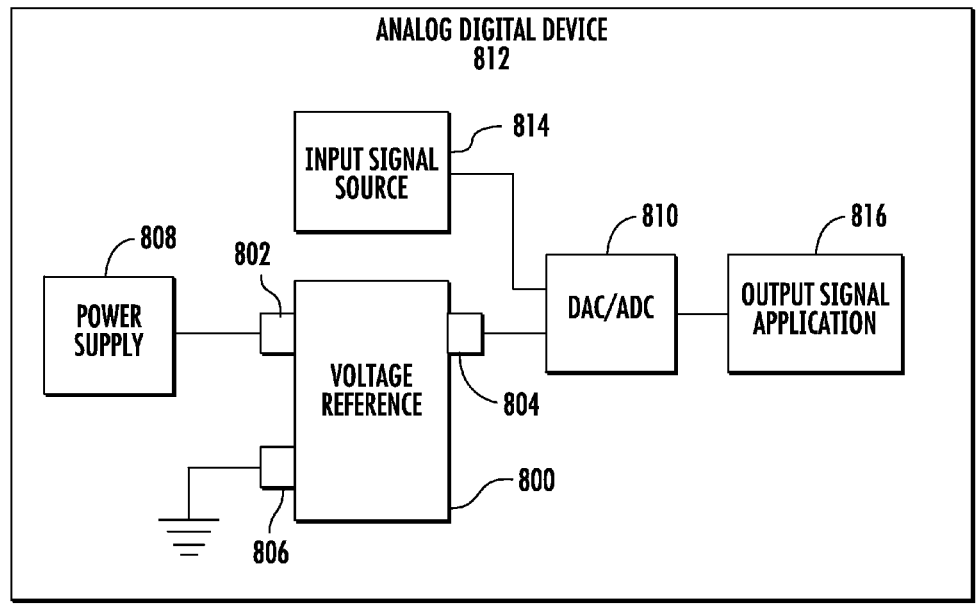
FIG. 8 is a block diagram of an exemplary implementation of a post package trimmed voltage reference.

FIG. 8 illustrates an exemplary implementation of a packaged integrated circuit that has been post packaged trimmed as described above. In particular, packaged integrated circuit acts as a voltage reference 800. In FIG. 8A, voltage reference 800 is used as a reference input on digital to analog converter/analog to digital converter (DAC/ADC) 810. Voltage reference 800 receives an input voltage on first pin 802 from a power supply 808 and outputs a reference voltage on second pin 804. Voltage reference 800 further references the output reference voltage against a ground reference connected to ground pin 806.

DAC/ADC 810 operates as part of Analog digital device 812. Analog digital device 812 is a device that receives an analog signal and converts it to a digital signal, receives a digital signal and converts it to an analog signal, or converts both digital signals to analog signals and analog signals to digital signals. For example, analog digital device 812 is a device that performs at least one of digital metering, bar code scanning, battery managing, and the like. Analog digital device 812 could also function as a base station and be implemented in industrial equipment. DAC/ADC 810 receives an input signal from input signal source 814 and outputs the signal for processing by an output signal application 816. In one implementation, where DAC/ADC 810 is an ADC, input signal source 814 provides an analog signal and output signal application 816 operates on a digital signal. Alternatively, where DAC/ADC 810 is a DAC, input signal source 814 provides a digital signal and output signal application 816 operates on an analog signal.

In some implementations, where the packaged integrated circuit is a voltage reference, the voltage reference provides a reference voltage as a bias for an amplifier. As one having skill in the art would recognize, post package trimming as described above is applicable to integrated circuits used in several different applications.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A method for controlling performance of an integrated circuit using a zero-pin serial interface, comprising:
   identifying a desired performance characteristic of an integrated circuit;
   transmitting a first change mode signal into the integrated circuit through a first pin, wherein the first change mode signal causes the integrated circuit to enter an instruction reception mode;
   transmitting a digital performance adjusting instruction into the integrated circuit through a second pin when the integrated circuit is in the instruction reception mode, wherein the second pin is coupled to a data detection circuit configured to acquire data from the digital performance adjusting instruction when the integrated circuit is in the instruction reception mode, wherein the integrated circuit changes an output performance for the integrated circuit as specified by the acquired data by blowing fuses out of order;
   transmitting a second change mode signal into the integrated circuit through the first pin, wherein the second change mode signal causes the integrated circuit to enter the normal operation mode, wherein the integrated circuit outputs a signal through the second pin when the integrated circuit is in the normal operation mode;
   comparing the output performance of the integrated circuit to the desired performance characteristic, wherein the output performance is the performance of the integrated circuit during the normal operation mode and comprises the signal transmitted out of the integrated circuit through the second pin; and
   setting the integrated circuit to permanently provide the output performance when the output performance is within a desired tolerance of the desired performance characteristic.

2. The method of claim 1, wherein the integrated circuit is a voltage reference device.

3. The method of claim 2, wherein the first pin receives an input voltage during the normal operation mode and the second pin outputs a voltage reference during the normal operation mode.

4. The method of claim 2, wherein the voltage reference provides a reference voltage to at least one of:
   a digital to analog converter;
   an analog to digital converter; and
   an amplifier.

5. The method of claim 1, wherein the first change mode signal is a voltage transition from a high voltage to a low voltage.

6. The method of claim 1, wherein the second change mode signal is a voltage transition from a low voltage to a high voltage.

7. The method of claim 1, wherein the first and second change mode signals are an input voltage detected by a first input circuit, wherein the first input circuit is connected to the first pin.

8. The method of claim 7, wherein the first input circuit:
   divides the input voltage with a voltage divider to acquire a divided voltage;
   determines when the divided voltage is less than a bandgap voltage; and
   when the divided voltage is less than the bandgap voltage, directing the integrated circuit to enter the instruction reception mode.

9. The method of claim 1, wherein the digital performance adjusting instruction is received by a data detection circuit, wherein the data detection circuit is connected to the second pin.

10. The method of claim 9, wherein the data detection circuit:
   divides an input signal received on the first pin into a plurality of signals having a first voltage level and a second voltage level using a plurality of voltage dividers, the first voltage level being greater than the second voltage level;
   derives a data portion of the digital performance adjusting instruction by determining when the digital performance adjusting instruction is greater than the first voltage level;
   derives a clock portion of the digital performance adjusting instruction by determining when the digital performance adjusting instruction is greater than the second voltage level;
   delays the clock portion by a predetermined amount of time;

uses the clock portion for synchronizing with the digital performance adjusting instruction; and processing the data portion.

11. The method of claim 1, wherein the digital performance adjusting instruction comprises at least one of:
   an action command that instructs the integrated circuit to perform an action that does not require specific data;
   a data access command that accesses data at a specified location on the integrated circuit; and
   a blow fuses command that instructs the integrated circuit to blow specific fuses.

12. A system for controlling performance of an integrated circuit, comprising:
   an integrated circuit;
   a first pin connected to the integrated circuit and configured to receive a mode control signal;
   a first input circuit connected to the first pin, the first input circuit configured to determine whether the integrated circuit is in an instruction reception mode or a normal operation mode based on the mode control signal;
   a second pin connected to the integrated circuit, wherein the integrated circuit is configured to receive a digital instruction signal through the second pin when the integrated circuit is in the instruction reception mode and transmit an output signal through the second pin when the integrated circuit is in the normal operation mode; and
   a second input circuit connected to the second pin, the second input circuit configured to receive the digital instruction signal received on the second pin, wherein the second input circuit is configured to detect data from the digital instruction signal when the integrated circuit is in the instruction reception mode, wherein the integrated circuit changes the performance of the integrated circuit in the normal operation mode as specified by the detected data by blowing fuses out of order.

13. The system of claim 12, wherein the integrated circuit is a voltage reference device.

14. The system of claim 13, wherein the first pin receives an input voltage during the normal operation mode and the second pin outputs a voltage reference during the normal operation mode.

15. The method of claim 13, wherein the voltage reference provides a reference voltage to at least one of:
   a digital to analog converter;
   an analog to digital converter; and
   an amplifier.

16. The system of claim 12, wherein the mode control signal instructs the integrated circuit to transition from the normal operation mode into the instruction reception mode by transitioning from a high voltage to a low voltage.

17. The system of claim 12, wherein the mode control signal instructs the integrated circuit to transition from the instruction reception mode to the normal reception mode by transitioning from a high voltage to a low voltage.

18. The system of claim 12, wherein the first input circuit comprises:
   a voltage divider configured to obtain a comparison voltage from the mode control signal;
   a comparator configured to determine whether the comparison voltage is less than a bandgap voltage; and
   a one shot detector configured to transmit a signal to the integrated circuit instructing it to enter the instruction reception mode when the comparator determines that the comparison voltage is less than the bandgap voltage.

19. The system of claim 12, wherein the second input circuit comprises:

a plurality of voltage dividers configured to divide the mode control signal into a plurality of signals having a first voltage level and a second voltage level, the first voltage level being greater than the first voltage level;
a data comparator configured to acquire data from the digital instruction signal by determining when the digital instruction signal is greater than the first voltage level;
a clock comparator configured to acquire a synchronization signal from the digital instruction signal by determining when the digital instruction signal is greater than the second voltage level;
a delay unit configured to delay the synchronization signal by a predetermined amount of time; and
a logic state machine configured to respond to the acquired data and delayed synchronization signal.

20. The system of claim 12, wherein the digital instruction signal transitions between one quarter of a high voltage and three quarters of the high voltage.

21. The system of claim 12, wherein the digital instruction signal comprises at least one of:
   an action command that instructs the integrated circuit to perform an action that does not require specific data;
   a data access command that accesses data at a specified location on the integrated circuit; and
   a blow fuses command that instructs the integrated circuit to blow specific fuses.

22. A method for setting an output voltage of a voltage reference device after packaging, the method comprising:
   identifying a desired output voltage for the voltage reference device;
   transmitting a first change mode signal into the voltage reference device through a first pin, wherein the first change mode signal is processed by a first input circuit, the first input circuit directing the voltage reference device to enter an instruction reception mode, wherein the first pin receives an input voltage during a voltage output mode;
   transmitting a digital performance adjusting instruction into the voltage reference device through a second pin, wherein the digital performance adjusting instruction is processed by a second input circuit, the second input circuit acquiring command data and synchronization information from the digital performance adjusting instruction when the integrated circuit is in the instruction reception mode, wherein the voltage reference device blows specific fuses out of order as directed by the command data, wherein the integrated circuit outputs a voltage reference through the second pin during the voltage output mode;
   transmitting a second change mode signal into the voltage reference device through the first pin, wherein the second change mode signal causes the voltage reference device to enter the voltage output mode;
   comparing an output voltage of the voltage reference device to the desired output voltage of the voltage reference device, wherein the output voltage is the voltage reference output from the second pin during the voltage output mode; and
   setting the voltage reference device to permanently transmit the output voltage from the second pin when the output voltage is within a desired tolerance of the desired output voltage.

23. A system for post package trimming a device, the system comprising:
   a packaged integrated circuit having a plurality of pins, wherein each pin in the plurality of pins has a functional purpose when the packaged integrated circuit operates in a normal operation mode, the packaged integrated circuit comprising:

a first input circuit connected to a first pin in the plurality of pins, the first input circuit configured to determine whether the packaged integrated circuit is in an instruction reception mode or a normal operation mode based on a mode control signal received on the first pin; and a second input circuit connected to a second pin in the plurality of pins, the second input circuit configured to acquire data from received digital commands through the second pin when the packaged integrated circuit is in the instruction reception mode and the packaged integrated circuit provides an output through the second pin when the packaged integrated circuit is in the normal operation mode, wherein the packaged integrated circuit changes performance of the packaged integrated circuit as specified by the acquired data by blowing fuses out of order;

at least one memory device configured to store a plurality of commands for transmission to the packaged integrated circuit; and a processing unit configured to control the mode control signal and transmit the mode control signal to the first pin, the processing unit also configured to transmit the digital commands to the second pin, wherein the processing unit compares the performance of the packaged integrated circuit and transmits digital commands to the packaged integrated circuit until the performance of the packaged integrated circuit is within a desired tolerance.

24. A system for converting a signal:

an input signal source configured to provide an input signal, wherein the input signal is in a first format;

a signal converter configured to convert the input signal into an output signal, wherein the output signal is in a second format;

an output signal application configured to receive the output signal from the signal converter;

a voltage reference comprising:

a first input circuit configured to determine whether the voltage reference is in an instruction reception mode or a normal operation mode based on a received mode control signal;

an output pin through which the voltage reference is configured to receive a digital instruction signal when the voltage reference is in the instruction reception mode and transmit a reference voltage to the signal converter when the voltage reference is in the normal operation mode, wherein the voltage reference blows specific fuses out of order as directed by the digital instruction signal; and a second input circuit configured to derive data and synchronization information from the instruction signal received through the second pin when the voltage reference is in the instruction reception mode; and a power supply configured to provide a mode control signal to the voltage reference on the first pin such that the voltage reference remains in normal operation mode.

* * * * *